United States Patent [19]
Healey et al.

[11] Patent Number: 5,357,250
[45] Date of Patent: Oct. 18, 1994

[54] ADAPTIVE COMPUTATION OF SYMBOL PROBABILITIES IN N-ARY STRINGS

[75] Inventors: Paul D. Healey, San Jose; Jorma J. Rissanen, Los Gatos, both of Calif.

[73] Assignee: International Business Machines Corporation, Armonk, N.Y.

[21] Appl. No.: 979,699

[22] Filed: Nov. 20, 1992

[51] Int. Cl.$^5$ .............................................. H03M 7/00
[52] U.S. Cl. ................................................... 341/107
[58] Field of Search ........................... 341/107, 51, 55

[56] References Cited

U.S. PATENT DOCUMENTS

| | | | |
|---|---|---|---|
| 3,769,453 | 10/1973 | Bahl et al. | 178/6 |
| 4,325,085 | 4/1982 | Gooch | 358/261 |
| 4,355,306 | 10/1982 | Mitchell | 340/347 DD |
| 4,516,246 | 5/1985 | Kenemuth | 375/37 |
| 4,591,908 | 5/1986 | Hirano | 358/136 |
| 4,633,490 | 12/1986 | Goertzel et al. | 375/122 |
| 4,725,885 | 2/1988 | Gonzales et al. | 358/135 |
| 4,785,356 | 11/1988 | Gonzales et al. | 358/260 |
| 4,791,403 | 12/1988 | Mitchell et al. | 341/51 |
| 4,862,167 | 8/1989 | Copeland, III | 341/107 |
| 4,891,643 | 1/1990 | Mitchell et al. | 341/107 |
| 4,905,297 | 2/1990 | Langdon, Jr. et al. | 382/56 |
| 4,933,883 | 6/1990 | Pennebaker et al. | 364/554 |
| 4,935,882 | 6/1990 | Pennebaker et al. | 364/554 |
| 4,973,961 | 11/1990 | Chamzas et al. | 341/51 |
| 5,023,611 | 6/1991 | Chamzas et al. | 341/51 |
| 5,025,258 | 6/1991 | Duttweiler | 341/107 |

OTHER PUBLICATIONS

Adaptive Model for Nonstationary Sources, IBM Technical Disclosure Bulletin, vol. 28, No. 11, Apr. 1986.
J. Rissanen, Stochastic Complexity, Journal of the Royal Statistical Society, Series B, vol. 49, No. 3, 1987.

*Primary Examiner*—Brian K. Young
*Attorney, Agent, or Firm*—James C. Pintner

[57] ABSTRACT

A method and apparatus are provided for adaptively and predictively determining probabilities of occurrence for each symbol of a finite alphabet within a symbol string. A plurality of intervals are defined over a portion of the symbol string. As successive new symbols are added to the string, they enter the intervals, and old symbols pass out of the intervals. A probability for each symbol of the alphabet is maintained and updated by the following process. For each new symbol which enters the intervals, it is determined whether the new symbol is a given character of the alphabet, and whether each old symbol leaving each interval is the given character. Accordingly, the number of occurrences of the given character within each interval may change. A probability update value is determined, having a component from each interval determined by whether the number of occurrences of the given character in that interval changed. Preferably the update value is a binary number having a bit position corresponding to each interval. The probability of occurrence of the given symbol is updated using the probability update value.

43 Claims, 7 Drawing Sheets

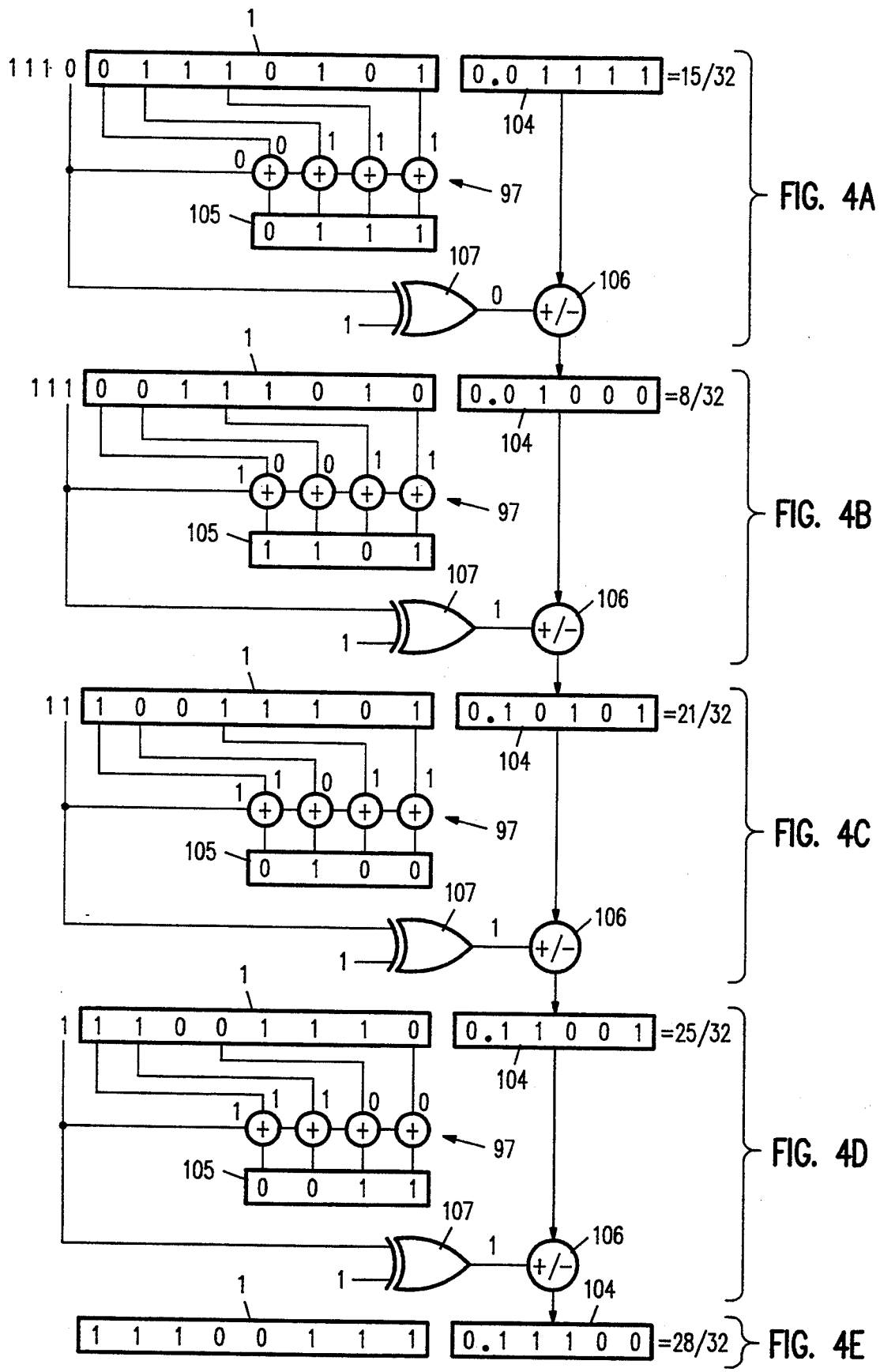

ADAPTIVE COMPUTATION OF SYMBOL PROBABILITIES IN N-ARY STRINGS

FIELD OF THE INVENTION

The present invention generally relates to the field of data encoding. More specifically, the invention relates to computing symbol probabilities based on prior occurrences of the symbols in a symbol string or data stream.

BACKGROUND OF THE INVENTION

Numerous techniques and systems have been developed for improving the efficiency of data storage or transmission of data between remote points. Data often comprises a string of coded symbols from a predetermined symbol set, referred to by the term "alphabet". A well-known example is the American Standard Code for Information Interchange (ASCII), which codes alphanumerics, punctuation marks, and various special command characters, in terms of binary values. Of course, any other symbol set, which could include numerals, punctuation or diacritical marks, or binary or other representations thereof, fall within the scope of the present subject matter. The term "alphabet" will be used in its broadest sense, to cover any such symbol set.

Some types of symbols, such as ASCII symbols, are all of equal length, In a character based data communications environment, however, not all possible characters appear with equal frequency. It is known to be inefficient to assign codes of equal length to all characters (like ASCII codes), regardless of their frequency of occurrence. To improve efficiency, various data compression schemes have been used. These schemes generally encode symbols with codes whose bit lengths increase, in a general sense, as the probability of occurrence of the symbol decreases.

Such a technique of data compression or encoding is referred to as "entropy encoding". In entropy encoding, more probable events are represented by codewords characterized by a relatively small number of bits, whereas less probable events are represented by a relatively large number of bits. The correct assignment of codeword lengths is dictated by information theory concepts, and is based on the estimated probability of occurrence of the events. The better the probability estimate, the more efficient the codeword length assignment, and the better the compression.

It would be possible to calculate a frequency-of-occurrence distribution by accumulating a quantity of data, calculating overall probabilities for each symbol in the data, and encoding the data in bulk before transmission. However, it is preferable that the probability of occurrence of a symbol of an alphabet in a symbol stream be predicted causally, i.e., based on occurrences of symbols prior to the symbol to be encoded, but not on occurrences of symbols subsequent to the symbol to be encoded. This is because coded symbols are decoded as they are received. At the time of arrival of a given coded symbol, only the previously received coded symbols are available to the receiver.

Generally, the probability of an event or occurrence is initially determined as an estimate from previous data or an initial estimate based on intuition, mathematics, assumptions, statistics collections, or the like. The predictive value of the initial estimate is then measured by subsequently occurring events.

In some prior technology, probabilities of occurrence for the symbols are determined before data processing, and then remain fixed. Data are encoded in accordance with these fixed probabilities. These systems have the drawback that results obtained are based on probability values which generally do not reflect the actual rates of occurrence of the characters, since these rates vary with the positions in the data stream of the characters. As a consequence, the data stream is not coded with optimal efficiency.

One prior art data compression system relies on the frequency of a symbol occurrence in both an encoding and decoding device. In Kenemuth, U.S. Pat. No. 4,516,246, "Data Compression System", a series of characters in a data stream are encoded in compressed form by using a histogram of a sample of a symbol stream to determine the frequency of symbols in the stream. The method is adaptive, inasmuch as the frequency, or histogram, is reevaluated upon the arrival of a new symbol. However, this method has a shortcoming that encoding is based on a frequency distribution within a past interval of fixed size. This limits the sensitivity to symbol trends or tendencies.

Other prior art adaptive data compression systems rely on an adaptation of the rate probability estimation. In Duttweiler, U.S. Pat. No. 5,028,258, "Adaptive Probability Estimator for Entropy Encoding/Decoding", more accurate estimation of probability estimates are obtained by controllably adjusting the adaptation rate of the probability estimator. That is, an adaptation rate is optimized by matching it to the actual probability values being estimated. In particular, the adaptation rate is optimized to be proportional to the inverse of the smallest probability value being estimated. This method is also adaptive to the extent that the probability estimation of the lag symbol occurrences is variable. However, since the probability estimations are based on the relative frequencies of past symbol occurrences, but not on their distribution over time, actual trends in symbol occurrence frequency may still not be anticipated.

In the related Chamzas et al., U.S. Pat. No. 5,023,611, "Entropy Encoder/Decoder Including a Context Extractor", more accurate estimation of probability estimates are obtained by adjusting the configuration of the interval of a context extractor used to define the context of symbols. While this method improves on the fixed-interval method, it must necessarily ignore the effects of the non-chosen intervals at each point in time.

Therefore, to overcome the drawbacks of the conventional techniques described above, a data compression technique for use in a data communications environment should preferably weight the occurrences of the symbols so that trends in symbol occurrences are taken into account in calculating probabilities, preferably giving heavier weight to occurrences in the more recent past. Such a technique should be able to efficiently compute the best code assignments for all possible symbols based upon the distribution of symbols which have already been transmitted. It should be able to detect changes in the frequency distribution of symbols in a symbol stream and adapt its encoding scheme accordingly.

SUMMARY OF THE INVENTION

It is an object of the invention to provide a system and method for determining symbol occurrence probabilities for use in data compression and encoding which is adaptive and which facilitates improved data compression by establishing symbol occurrence probabilities based on trends in past symbol occurrences.

It is a further object of the invention to provide a system and method for determining symbol occurrence probabilities for use in data compression and encoding which weights past symbol occurrences, giving greater weight to more recent symbol occurrences.

It is a further object of the invention to provide a system and method for determining symbol occurrence probabilities for use in data compression and encoding which takes into account symbol occurrences in a plurality of past intervals to estimate the probabilities of future symbol occurrences.

Adaptive computation of the probability of a given symbol occurring is determined by first computing the estimate of an initial probability of the given symbol occurring. The initial probabilities for the symbols of the alphabet may be computed by any known means which produces probability values consistent with the past occurrences of the symbols within the symbol string. This is because, initially, a symbol memory or "context extractor" (described in detail below) contains the past occurrences of the symbols, and subsequent probabilities will be calculated based, in part, on those past occurrences of the symbols.

A preferred method for calculating the initial probabilities is to count the number of symbol occurrences within a predefined interval or within a number of nested intervals and taking the average of a normalized count of symbol occurrences within each of the nested intervals. Each symbol within the symbol alphabet is provided with its own probability estimate and corresponding probability register.

In accordance with the invention, a plurality of intervals are used. The intervals are nested, i.e., each nested interval shares a common first position in the symbol string which contains the most recent symbol. The intervals include various numbers of consecutively received symbols which pre-date the most recently received symbol. Preferably, the number of nested intervals is equal to an integral power of 2. It is also preferable that the intervals be subject to certain size constraints. Generally, the intervals should have lengths, in terms of the number of symbols they contain, which are all powers of the same base. Alternatively, the intervals can have sizes whose ratios are integral powers of two. In a preferred embodiment which will be discussed in detail, the sizes of the intervals are integral powers of two.

The symbols currently in the intervals altogether make up a symbol context. A probability that the next symbol will be any given symbol of the alphabet is determined based on the number of occurrences of that given symbol currently in the intervals. A new symbol, entering a symbol context, enters each interval at the most recent symbol position of each interval, and, in effect, pushes the least recently arrived symbol out of each interval.

The new symbol defines a plurality of new symbol partial probability variances, one associated with each nested interval. The new symbol also defines an overall new symbol variance, which represents a partial incremental change in probability of symbol occurrence. For the symbol which matches the new symbol, the probability variance due to the new symbol is an increase in probability. For all other symbols, the probability variance due to the new symbol is no change in probability. The new symbol partial probability variance for a given interval is defined as the reciprocal of the length of the interval. The new symbol variance is defined as an average of the new symbol partial probability variances over all of the intervals.

Similarly, each old symbol leaving each nested interval defines an old symbol partial probability variance for each symbol for the respective interval. For any interval in which the old symbol leaving the interval matches a given symbol, the old symbol partial probability variance is a decrease in probability for that given symbol. For all other intervals, the old symbol partial probability variance is no change in probability for that given symbol. An overall old symbol probability variance is calculated for each of the symbols in the alphabet. For a given symbol, the old symbol probability variance is the average of the old symbol partial probability variances over the intervals which lose an occurrence of that given symbol. The old symbol partial probability variance for a given interval is defined as the reciprocal of the length of the interval.

Thus, given a probability of occurrence for a given symbol as of a time prior to the arrival of a new symbol, the probability of occurrence for that given symbol as of a time subsequent to the arrival of the new symbol is calculated by adding and subtracting symbol variances. Specifically, the new symbol variance, which has a positive value if the new symbol is the given symbol and a zero value otherwise, is added to the old probability, and the old symbol variance, which has a positive component for each old symbol that matches the given symbol and zero value components for each old symbol that does not match the given symbol, is subtracted from the old probability.

The mathematical and logical combination of the new symbol incremental variance and the old symbol incremental variance is one that is mathematically and logically equal to an EXCLUSIVE OR (XOR) comparison of the old and new symbols. If a new symbol and an old symbol leaving an interval either both match or both do not match the given symbol, then the number of occurrences of the given symbol in that interval does not change, i.e., the combined probability variance for that interval is zero. If one of the new and old symbols match the given symbol, but the other does not, then the number of occurrences of the given symbol in that interval changes, and the probability variance has a non-zero value. Therefore, preferred embodiments of the invention, described below, employ XOR devices to determine a Boolean difference between the new and old symbols on a per-interval basis, to determine whether the probability variance has a non-zero value.

Subsequent probability estimates may therefore be estimated by the XOR comparison of subsequent new symbol variances and old symbol variances. The comparison produces a variance magnitude, including a component from each interval, which is then either added to or subtracted from an initial probability, to produce an updated probability. Thus, manipulation of entire data within a symbol context to determine subsequent probability estimates is avoided.

When the number of nested intervals is taken as an integral power of two, and the interval lengths are also taken as powers of two, probability estimates may be based on new symbol and old symbol variances to initial probabilities for each symbol within a symbol alphabet with advantageously simple calculations.

BRIEF DESCRIPTION OF THE DRAWINGS

FIGS. 4A-4E are five snapshots showing the operation of the probability estimator of FIG. 3B for a given symbol of the binary alphabet as a stream of symbols, some matching the given symbol, some not, are received.

DETAILED DESCRIPTION OF THE INVENTION

Figure 1:
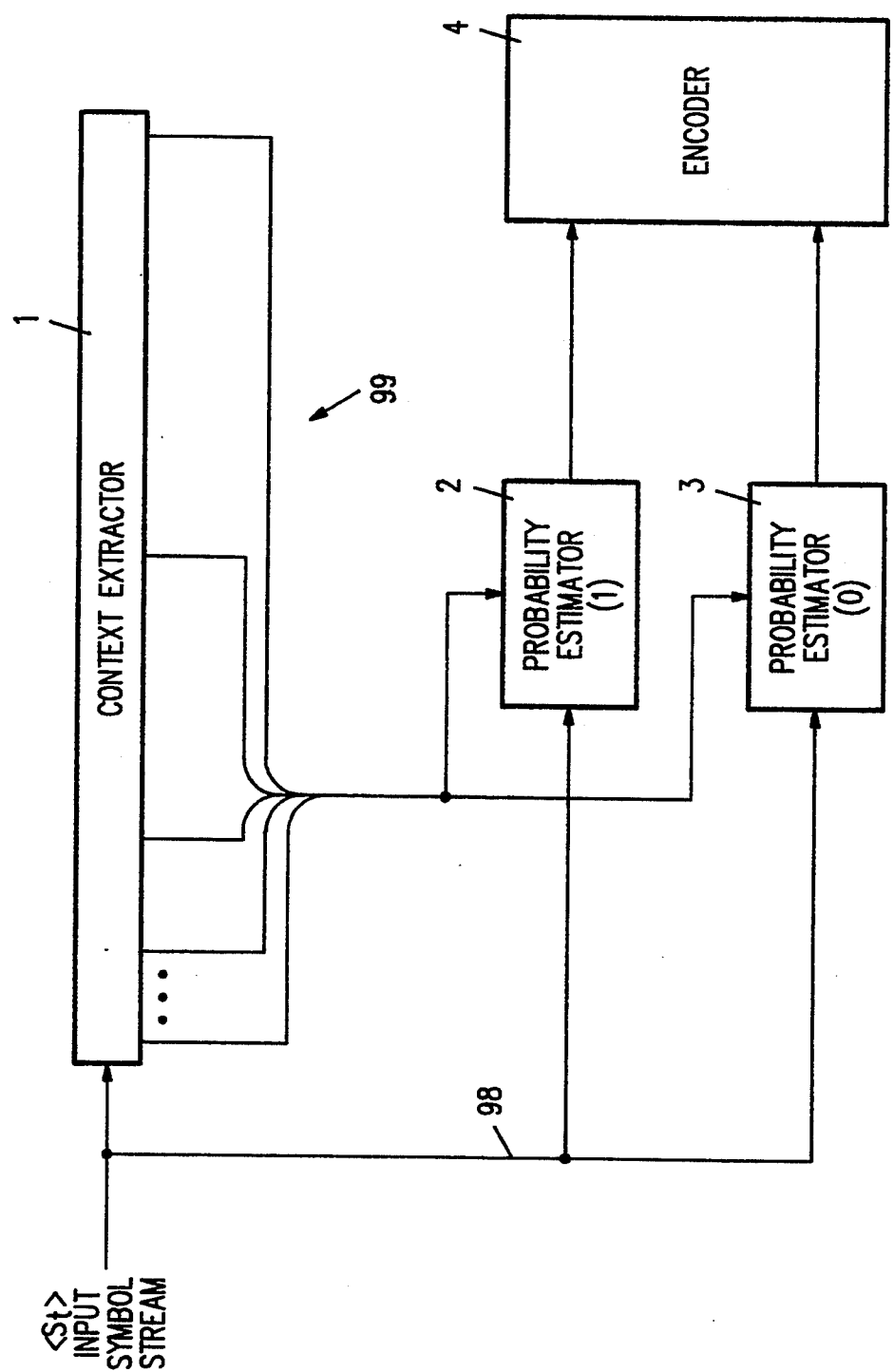
FIG. 1 is a block diagram of a probability estimator for n binary alphabet according to a first embodiment of the invention.

In accordance with the present invention, a method and apparatus are provided for determining probabilities of occurrence of symbols or an alphabet within a symbol stream based on past occurrences or the symbols, and trends in the occurrences. Such probabilities may then be used advantageously for assigning codes to each symbol to be encoded, such that the more frequently a character is predicted to appear in the symbol string, the shorter its code will be.

A basic frequency model of order N is one in which the probability of a symbol occurring as a next symbol within a symbol string or context is equated according to the symbol frequency in an interval of length N ending with the current symbol. Such models are adaptive, since probabilities are a function of a finite past, but they assign uniform weight to each symbol occurrence in the context of past symbols. According to a basic frequency model, the probability $p_{(s)}$ of a given symbol s appearing in the symbol stream is defined as the ratio of the number of occurrences n(s) of the symbol s to the total number of symbols N in the sample window. Thus, $$p(s) = \frac{n(s)}{N} \quad (1)$$

These probabilities are calculated for each of the symbols.

In the estimate of expression (1), equal weighting or value is given to any and/or all occurrences of a given symbol within the interval. That is, each symbol occurrence carries an equal weighting or significance, without regard to the relative distances of the given symbol occurrences within the current interval from the current point in time.

A more sophisticated adaptive computation of an estimate of the symbol probability is made by adapting to local changes in statistics. A decreasing weight or significance is assigned to given symbol occurrences as their distances from the current point in time increase.

For example, an adaptive frequency model of order N may be generally defined as:

$$p(s) = \sum_{k=0}^{m-1} \phi_k \frac{C_s(I_k)}{k}, \text{ where } \phi_k \geq 0, \text{ and } \sum_{k=0}^{m-1} \phi_k = 1 \quad (2)$$

where m is the number of intervals, $\Phi_k$ is a weight factor of the kth interval, and $C_s(I_k)$ is the count of the given symbol s in interval $I_k$. Expression (2) represents a convex-weighted average of the estimates from component basic frequency models.

The term "forgetting factor" was used in Mohiuddin, et al., "Adaptive Model for Nonstationary Sources", IBM Technical Disclosure Bulletin, Vol. 28, No. 11, April 1986, pp. 4798-4800, as providing an alternative to a "sliding window" for a symbol string. While expression (2) is expressed in terms of frequency, i.e., frequency of occurrence of a given symbol in an interval, it may be expressed, in a mathematically equivalent formulation, in terms of time, as follows:

$$p(s) = \sum_{k=0}^{m-1} \omega_k \delta_{s,k}, \quad (3)$$

where $$\omega_0 \geq \omega_1 \geq \ldots \geq \omega_{m-1} \geq 0, \text{ and } \sum_{k=0}^{m-1} \omega_k = 1.$$

In this equivalent form, expression (3) provides an alternative to the "forgetting" factor of Mohiuddin, et al., in adaptively computing the probability of a next symbol occurrence.

Expressions (2) and (3) exemplify the manner in which a class of distributions is integrated with respect to a "prior" distribution in Rissanen's stochastic complexity formalism (Rissanen, "Stochastic Complexity", Journal of the Royal Statistical Society, Series B., Vol. 49, No. 3, 1987). In the expression (2), the prior distribution consists of the weights $\Phi_k$, the class of distributions are those determined by the basic frequency models at time t, and the set of strings or intervals being modeled is simply the set of "next" symbols, or the finite alphabet. There remains, however, the question of selecting a prior distribution.

Suppose one takes into account all intervals up to, say, length n, with weights proportional to $$\frac{1}{k+1}$$

for the k-th interval, where $0 \leq k \leq n-1$. Mathematically, if not intuitively, it is clearly not simple to update an entire adaptive frequency model when the weights $\Phi_k$ in expression (2) are even as complex as $$\frac{1}{k+1}.$$

As each symbol occurrence moves one step into the past, computation of its new weight involves multiplication by a factor $$k + \frac{1}{k+2}.$$

Even if all possible weighting values are stored in advance, the total number of additions at each step is on the order of the number of symbols which change value.

In general, the use of the entire set of intervals given in expression (2) is computationally expensive. Therefore, the following approximation is made:

$$p_{(s)}(t) = \frac{1}{m} \sum_{k=0}^{m-1} \frac{C_s(t - 2^{l_k}, t - 1)}{2^{l_k}}, \quad (4)$$

where $C_s(a,b)$ is the number of occurrences of the symbol s in the symbol stream interval (a,b), and $l_k$ is the base 2 logarithm of the length of the k-th interval. By adding restrictions that the interval lengths are integral powers of two, i.e., $l_k$ are integers, that the weights are powers of two, and that the number of intervals n is a power of two, computational efficiency is achieved, and an advantageously simple method and apparatus for producing symbol probabilities may be realized. Setting $l_k = k$ in expression (4), for example, produces a very good approximation, with relatively few intervals, to the weighting scheme $$\frac{1}{k+1}$$

over all intervals.

In accordance with the invention, the weight factors $\Phi_k$ are applied to the previously occurring symbols of the string by defining intervals which subsume various consecutive groups of the previously occurring symbols. The intervals are nested, i.e., overlapped, so that respective ones of the previously occurring symbols fall within different numbers of the intervals. A probability variance is calculated for each interval. Therefore, the greater the number of intervals a given previously occurring symbol falls within, the greater the number of probability variances are influenced by the character, i.e., the greater the weight factor $\Phi_k$ for that symbol.

It will be seen that the number of intervals and their sizes relative to each other could vary within the spirit and scope of the invention. Also, the exact manner in which the intervals are nested could vary. All of these factors act to vary the relative weights applied to the different previously occurring symbols. However, it has been found that probability calculations are elegant and computationally efficient if certain constraints are placed on these factors. Therefore, the preferred forms of the invention conform to these constraints. They are as follows: All intervals include the most recent symbol, and include sets of consecutively received symbols ranging backward in time from the most recent symbol. The number of intervals is an integral power of 2, and the sizes of the intervals are powers of two. The smallest interval is preferably the size of a single symbol. While the interval sizes may be consecutive powers of two, they need not be. That is, for instance, a system employing eight intervals could have interval size ratios of 1:2:4:8:16:32:128:256:1024. It is sometimes desirable to omit certain powers of two, in this case 64 and 512, if statistical information about the symbol stream is known. Equivalently, this allows for approximation of weighting schemes other than $$\frac{1}{k+1}.$$

The preferred embodiments of the invention, illustrated in the drawings and described below, have these attributes.

Two classes of embodiments of the invention will be discussed. The first class includes embodiments which handle a binary symbol stream, i.e., a symbol stream for a binary alphabet having only two symbols, 0 and 1. The second class of embodiments handle n-ary symbols. Thus, in the second class there is no inherent limitation on the number of symbols in the alphabet. The symbols can be represented as n-bit binary numbers, as a character set, or in any other suitable form.

Referring to FIG. 1, a data stream is represented as a symbol string $<S_t>$ over a finite alphabet, S, the alphabet S including n symbols, and where t is the string index. At any given time t, the probability distribution on the alphabet S, as a function of past values $S_{t-m} \ldots S_{t-1}$, is desired.

According to a first embodiment of the invention, the alphabet S is binary, i.e., it includes only two symbols, 0 and 1, and the number of symbols of the alphabet n=2. For this simple case, it will readily be seen that the sum of the probabilities p(0) and p(1) for respective symbols 0 and 1 is $$p(0) + p(1) = 1$$

More generally, for a case in which an alphabet of n symbols is used, the sum of the probabilities for the n symbols in the alphabet is given as follows:

$$\sum_{i=0}^{n-1} p(i) = 1$$

The symbol string is provided as an input to a context extractor 1. The context extractor 1 extracts a context, or sample, on the symbol string $<S_t>$. For the purpose of this invention, a context is defined as a set of the symbols, received prior to the present time, which are stored in the context extractor 1. The context extractor 1 preferably includes a shift register for receiving and shifting symbols of the symbol string $<S_t>$ or a circular buffer, i.e. a queue, in which symbols are written into consecutive memory locations until the end of the buffer is reached, and then "wrapped around" back to the beginning.

The context extractor 1 further provides a plurality of nested intervals. The operation of memory structures, such as shift registers and queues, will be familiar to a person skilled in the art, so an elaborate discussion of the use of these devices will be omitted. Intervals are defined in terms of memory locations or shift register stages. Thus, when a new symbol ns is received and stored, the contents of each interval are, in effect, shifted, so that the new symbol is now in the position, within each interval, for the most recently received symbol. As each new symbol ns enters the context extractor 1, an old symbol $os_{(k)}$ is lost at the end of the kth interval. This is true for each of the m intervals, where $0 \leq k \leq m-1$.

The context extractor 1 includes suitable means, such as outputs, taps, or output pointers, for providing the old symbols from each of the n intervals.

A plurality of probability estimators are provided, one for each symbol s, or a total of m probability estimators. In the case of the illustrated system of FIG. 1 for operating on a binary symbol string, two probability generators 2 and 3 are shown. The probability generator 2 generates a probability that the binary symbol 1 will occur, and the probability generator 3 generates a probability that the binary symbol 0 will occur.

In general, for an n symbol alphabet, 1 minus the sum of the probabilities of any n−1 of the symbols equals the probability of the remaining symbol. Thus, it is possible to eliminate one of the probability generators and add suitable apparatus for making this calculation to produce the remaining probability. There are various ways of implementing a system using n−1 probability generators. Either each probability is subtracted from 1 in turn, the probabilities are added and the sum is subtracted from 1, or some combination thereof may be performed. It will be seen that in the case of a two symbol alphabet, such as a binary alphabet, this may be done advantageously. For larger alphabets, such implementations become more complex and less advantageous.

Figure 2:
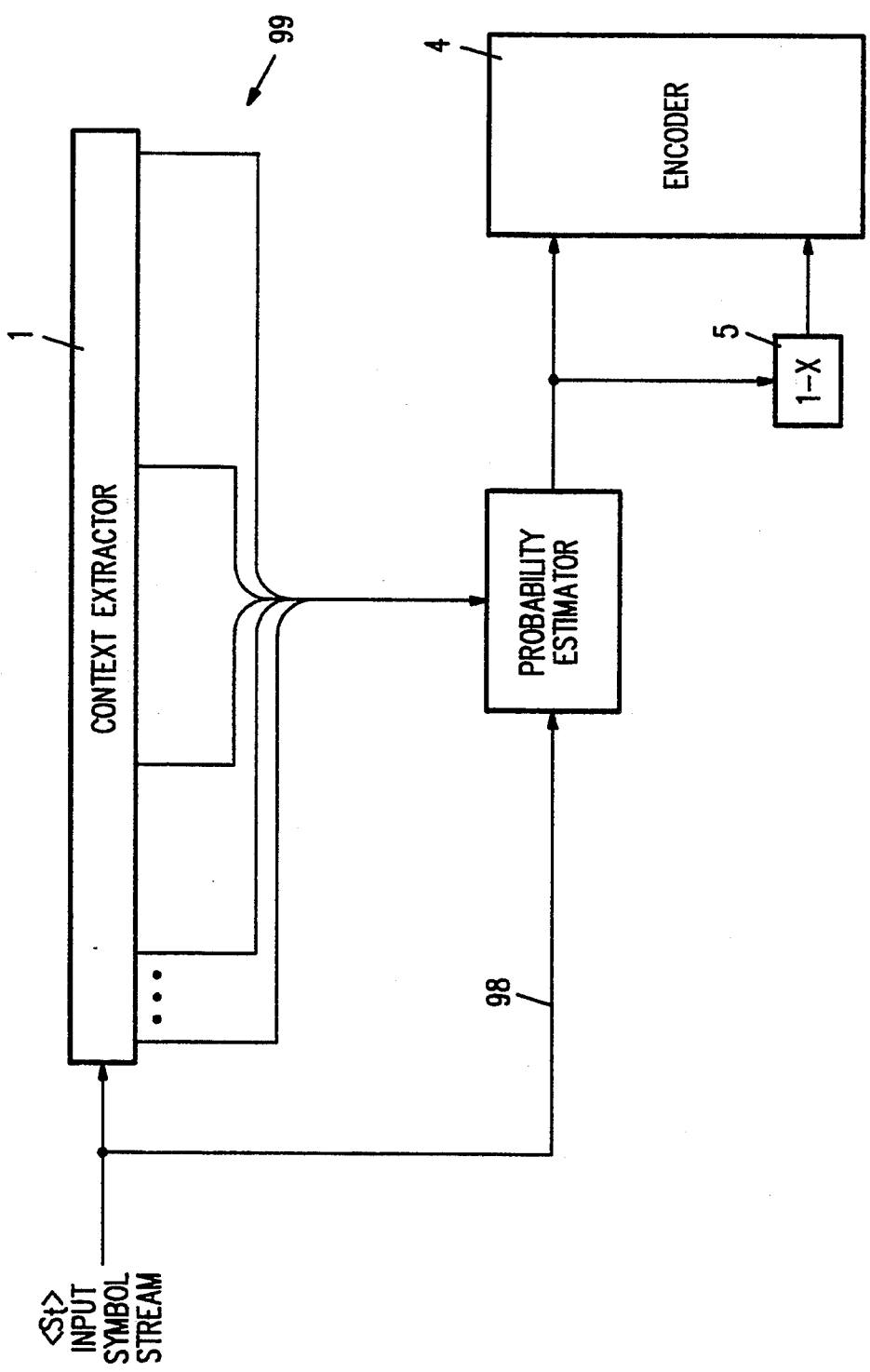
FIG. 2 is a block diagram of a probability estimator for a binary alphabet according to another embodiment of the invention.

FIG. 2 is a schematic diagram of a system similar to that of FIG. 1, except that suitable modifications have been made for determining the probabilities for both symbols of a binary alphabet using the subtraction scheme just described. One of the probability generators has been eliminated. Since there are only two symbols, there is no need to add probabilities or perform a sequence of subtractions. The probability produced by the probability generator 2 is merely subtracted from 1 by a subtractor 5, labeled "1-X", to produce the probability for the other symbol. It will be understood that, for a larger alphabet of n symbols, the embodiment of FIG. 2 would require n−1 probability generators, and either an adder for the n−1 probabilities they would produce or a suitable apparatus, such as a sequencer, for providing the probabilities as subtrahends to the subtractor 5.

The following discussion will focus back on FIG. 1, but is also applicable to FIG. 2, as appropriate. The probability of occurrence for each symbol within the finite alphabet is updated and stored in a respective one of the probability estimators 2. The old symbols $os_{(k)}$ are provided from the context extractor 1 to each of the probability estimators 2. A detailed description of a probability estimator is provided below.

To illustrate an environment in which the invention is to be practiced, an arithmetic encoder unit 4 is provided. The encoder 4 is coupled to receive the probabilities for each symbol of the alphabet. Using the probabilities produced in accordance with the invention, the encoder 4 effectively encodes the symbol stream with data compression coding. Consequently, the symbol stream can be transmitted more quickly, based on the next symbol probabilities set as a function of the past symbol occurrences, than could be done using conventional symbol coding.

Figure 3A:
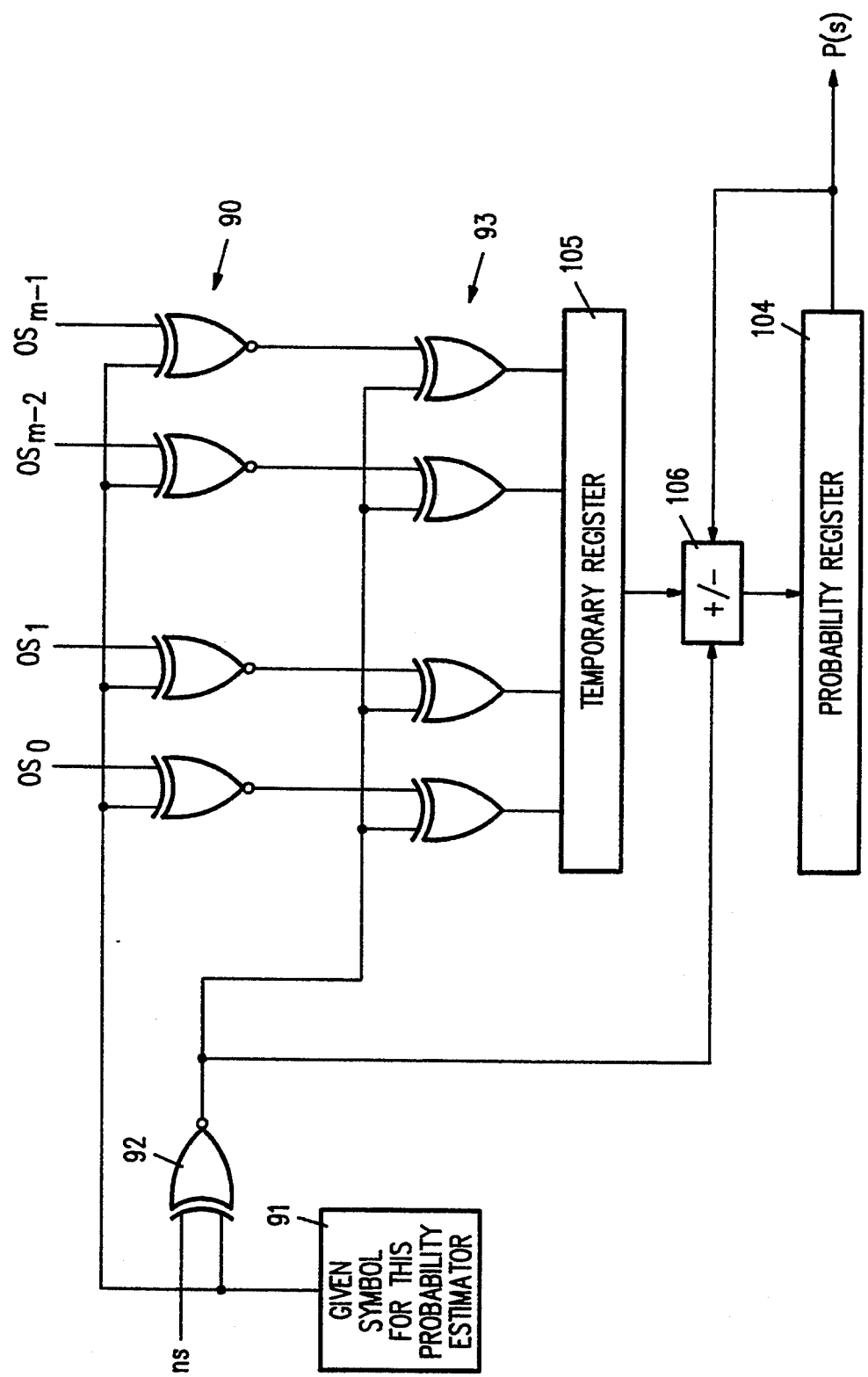
FIG. 3A is a detailed schematic diagram of a portion of the probability estimators of FIGS. 1 and 2 according to one embodiment of the invention.
Figure 3B:
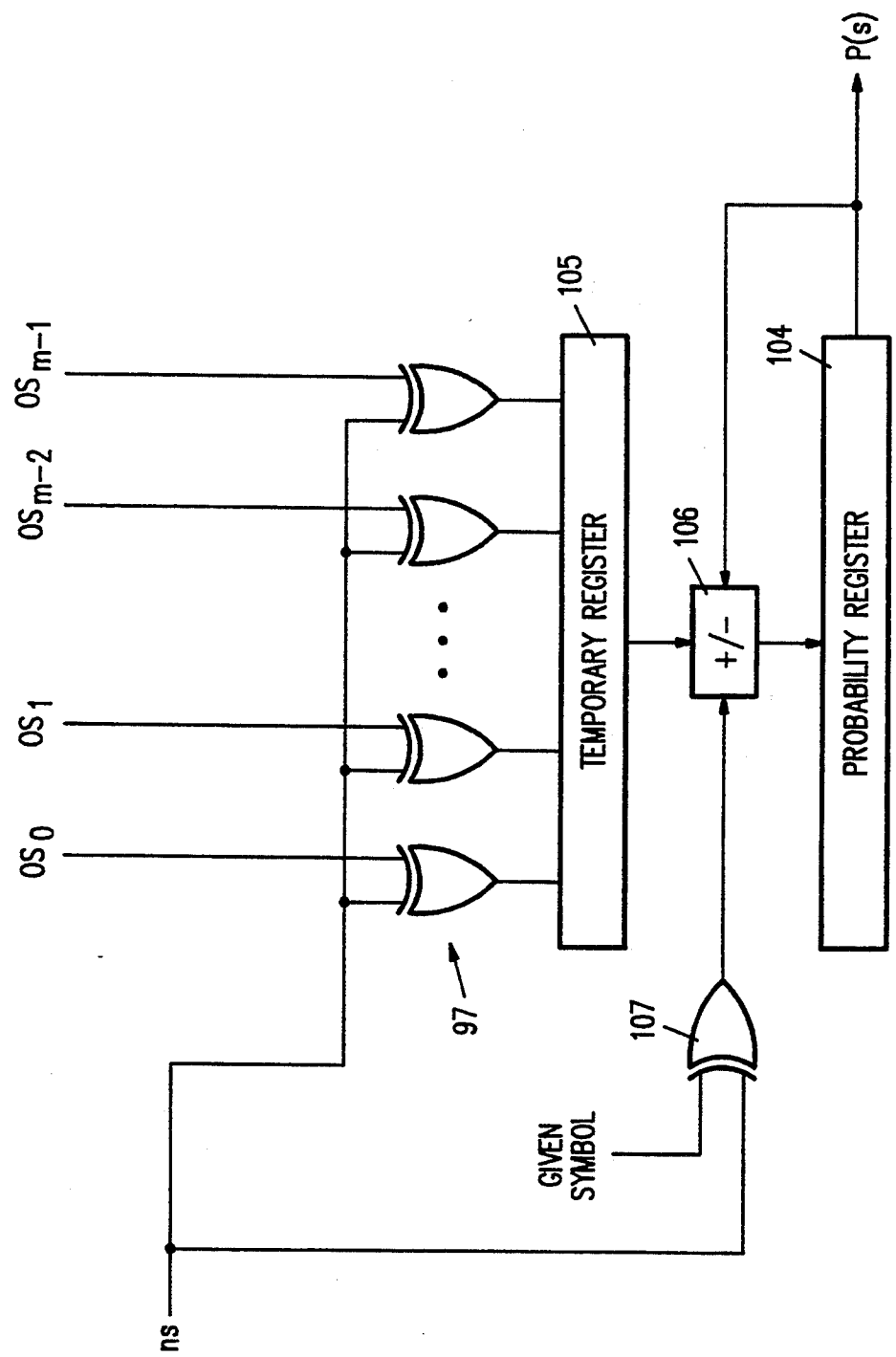
FIG. 3B is a detailed schematic diagram or a portion of the probability estimators of FIGS. 1 and 2 according to another embodiment of the invention.

FIGS. 3A and 3B are more detailed schematic diagrams of two embodiments of one of the probability estimators 2 and 3 of FIGS. 1 and 2. FIG. 3A is a general diagram which is usable for n-ary symbol alphabets. FIG. 3B is a simplified version which is usable for binary alphabets.

In both FIGS. 3A and 3B, a probability register 104 is provided for storing the representation of the probability $p_{(s)}$ of the given symbol associated with the probability estimator. In an initial state, the probability registers 104 contain initial probabilities for their respective symbols. This state is consistent with expression (3) at time t. That is, the initial probabilities for each symbol of the alphabet are stored in the probability registers 104 of the respective probability estimators prior to the commencement of operation. The initial probabilities are calculated based on past occurrences of the respective symbols in the portion of the symbol stream which is initially stored in the context extractor 1, in order to satisfy expression (4).

The initial probabilities are preferably determined in the following manner. First, previously occurring symbols of the symbol string are loaded into the context extractor 1, and various portions residing within the nested intervals are identified. For each interval, the number of occurrences of each symbol of the alphabet are counted. For each symbol in each interval, the number of occurrences is normalized, preferably by dividing by the total number of symbols in the interval. The probability for each symbol is then determined based on the normalized occurrences for each interval. This is preferably done by averaging the normalized occurrences. Finally, the result for each symbol is stored in its respective probability register.

After the initial probabilities have been calculated and stored, the system is ready to begin receiving new symbols of the symbol stream. Upon arrival of a new symbol, denoted by ns, the probabilities are modified in a manner to be described.

The invention offers a method of adaptively predicting the probability of a symbol occurrence based on an initial probability of the symbol occurrence as well as a variance to the initial probability. The variance to the initial probability comprises two components. The first is a new symbol variance, or the effect of a new symbol entering the first position in each and every nested interval on the initial probability of the given symbol. The second is an old symbol variance, or the effect of the oldest symbol leaving the last position in each nested interval on the initial probability of the given symbol.

Each interval within the set of nested intervals shares a common first position. When a new symbol ns, which is a given one of the symbols of the alphabet, arrives, it enters the most recent symbol position of each of the intervals. Thus, the number of occurrences of the given symbol in each interval increases by 1 (unless the old symbol os for one or more intervals is also the given symbol, in which case the number stays the same). The probability of the given symbol increases by virtue of the arrival of the new symbol in each of the intervals (unless, of course, the departure of the given symbol from one or more of the intervals cancels out the increase). The increase in probability caused by the arrival of the new symbol may be expressed as follows:

$$p_{ns}(t+1) = p_{ns}(t) + \frac{1}{m}\sum_{k=0}^{m-1}\frac{1}{2^{1k}} \quad (5a)$$

Each interval k loses a count of one for the old symbol, $os_{(k)}$, which passes out of it, where the value of the departing old symbol is that of the given symbol. In the preferred nesting arrangement for the intervals, each symbol departing from a given interval affects the number of occurrences of the given symbol for that interval and no others. The decrease in probability caused by the departure of an old symbol from an interval may be expressed as follows:

$$p_s(t+1) = p_s(t) - \frac{1}{m} \sum_{k:os(k)=s} \frac{1}{2^{lk}} \quad (5b)$$

Thus, expressions (5a) and (5b) provide a net effect upon a symbol probability for a new symbol entering a string context as well as old symbols leaving the last position of each of the plurality of nested intervals. If the value of an arriving new symbol and the value of each departing old symbol are all equal to the value of a given symbol, then the probability increment and decrement according to expressions (5a) and (5b), respectively, negate each other. Accordingly, the probability for the given symbol floes not change.

Referring again to FIGS. 1, 3A, and 3B, the old symbols $os_{(k)}$ from the context extractor 1 are provided to the probability estimators 2 and 3 over bus lines 99. Also, the incoming new symbol ns is provided to the probability estimators 2 and 3 over a bus 98. In accordance with the theoretical description provided above, each probability estimator calculates a change in the probability $p_{(s)}$ of occurrence of the respective given symbol, responsive to the arrival of each new symbol. The updated probability of occurrence of the given symbol is stored in the probability register 104 of FIGS. 3A and 3B. The change is calculated in terms of (i) whether the new symbol is the given symbol, and (ii) on a per-interval basis, whether the old symbol leaving the interval is the given symbol.

There are various ways of calculating the probability change. In accordance with a preferred embodiment of the invention, the apparatus of FIG. 3A or FIG. 3B is employed, and a method is practiced which will now be described.

Further in accordance with the preferred embodiment of the invention, the new symbol and old symbol probability variances are calculated in accordance with TABLE 1. A variance in the probability is determined for each interval, depending on whether the new symbol matches the given symbol and on whether the old symbol leaving that interval matches the given symbol. If both or neither of the new symbol and the old symbol match the given symbol, then no probability variance results from the arrival of the new symbol and the loss of the old symbol. On the other hand, if one of the old and new symbols matches the given symbol but the other does not, then there will be non-zero probability variance. As shown in TABLE 1, the sign of the probability variance, i.e., + or − for an increase or decrease in the probability, is determined by which, if any, of the old and new symbols match the given symbol for the probability estimator.

TABLE 1 tabulates these conditions, and shows the effect on probability for each case. In the first and fourth cases, the number of occurrences or given symbol in the interval does not change, so there is no resultant change to the probability. In the second case, the number of occurrences of the given symbol increase by one, so there is an increase in the probability. In the third case, the number occurrences of the given symbol decreases by one, so there is a decrease in the probability.

TABLE 1

| | New symbol matches given symbol | Old symbol matches given symbol | Probability variance |
|---|---|---|---|
| 1. | Y | Y | 0 |
| 2. | Y | N | + |
| 3. | N | Y | − |
| 4. | N | N | 0 |

The precise manner in which TABLE 1 is implemented differs between FIGS. 3A and 3B. The more general case of FIG. 3A will be discussed first, and then the simplified case of FIG. 3B will be discussed.

In FIG. 3A, there is shown a logic network for implementing TABLE 1. The old symbols $OS_0$ through $OS_{n-1}$ are provided from the context extractor 1 to inputs of an array 90 of logic devices, shown as EXCLUSIVE OR (XOR) gates. The devices of the array 90 also receive the given symbol, which is provided by suitable means 91. The array 90 performs the logical test in the middle column of TABLE 1 by XORing the old symbols with the given symbol to see whether the old symbols match the given symbol. The outputs of the devices are data or signals which represent a match or mismatch in accordance with the middle column of TABLE 1.

There is also provided a logic device 92 which receives the incoming new symbol and compares it with the given symbol. The device 92 is also shown as an XOR gate. There is additionally provided an array 93 of logic devices which receive the outputs of the devices 90 and the output of the device 92. On a per interval basis, the array 93 determines which of the four conditions of TABLE 1 exists. It will be seen from the right column of TABLE 1 that if the results of the tests made by the device 92 and one of the devices 90 match (that is, cases 1 and 4), then the probability change is zero. This agrees with intuition because if, for a given interval, the new and old symbols either both match the given symbol or both do not match, then the number of occurrences of the given symbol in the interval does not change. As a consequence, the probability of occurrence for the given symbol should not change.

In the FIGS., the XOR gates just described are shown as having high-true or low-true outputs, as appropriate. A detailed discussion of the appropriate logic phases of each of the outputs will be omitted here. A person skilled in the art, however, will readily recognize that particular implementations of the probability estimators in accordance with the invention will require a logic design providing appropriate high-true and/or low-true outputs. Such a skilled person would be able to prepare such a design without undue experimentation.

The logic devices 93 (XOR gates) produce outputs which reflect the absolute value of the probability variance. As per TABLE 1, the XOR gates produce outputs of a first value in the second and third cases, and outputs of a second value the first and fourth cases. The results are stored in a temporary register 105, in the form of a binary number. The respective bit positions of the binary number act as weight factors for the respective intervals. The temporary register 105 stores the result of the XOR operation performed on an arriving new symbol (ns) and the old symbols $os_{(k)}$ which are leaving the last position of each of the plurality of nested intervals stored in the symbol context extractor 101.

An adder/subtractor 106 is provided for adding the resultant binary number to, or subtracting it from, the probability value stored in the register 104. In accordance with the second and third cases of TABLE 1, addition or subtraction is performed based on whether the new symbol matches the given symbol.

The output of the XOR gate 92 provides a control signal to the adder/subtractor 106. The adder/subtractor 106 performs addition or subtraction based on the value of this signal. If the new symbol ns matches the given symbol, then the contents of temporary register 105 are added to the contents of the probability register 104 in order to adaptively estimate the probability of the given symbol at the subsequent interval ($p_s(t+1)$). If the new symbol ns does not match the given symbol, then the contents of temporary register 105 are subtracted from the contents of the probability register 105 in order to adaptively estimate the probability of the given symbol at the subsequent interval ($p_s(t+1)$).

The combination of expressions (5a) and (5b) represents a given symbol variance mathematically or logically expressed by the XOR operation. Each departing old symbol incremental variance (from expression (5b)) will be either zero (value of departing old symbol not equal to given symbol), or one (value of old symbol is that of given symbol). Further, an arriving new symbol variance (expression (5a)) will be either zero (value of new symbol not equal to given symbol) in every position, or will have a one in every position (value of new symbol is that of given symbol). If zero, then the value the old symbol incremental variances are to be subtracted from the probability estimate. If one, then the value of the new symbol incremental variances are to be added to the probability estimate, unless the value of a corresponding departing old symbol is also that of the given symbol. In the latter case, the effect of the arriving new symbol and departing old symbol negate.

The probability estimator shown in FIG. 3A is a general implementation of TABLE 1 and expressions (5a) and (5b). While a hardware implementation is shown, it will be understood that a software implementation could also be used. The software implementation would include suitable means for providing the old and new symbols, for storing the given symbol associated with a given probability estimator, for performing the comparisons of the symbols, and for adding or subtracting the resultant probability variance from the stored probability.

Logic devices as shown may be used for implementing a system which operates on a symbol stream from a binary alphabet. If an n-ary alphabet is used, then comparisons between the symbols are performed in essentially the same manner, although the XOR gates shown would be replaced by devices in accordance with the particular nature of the n-ary alphabet. For instance, if a symbol stream of bit representations of ASCII symbols is used, then the symbols are compared on a bit-by-bit basis, for instance by using an array of two-input XOR gates. Then, in order to produce an overall determination of whether the symbols match, the outputs of these XOR gates are ORed together. The output of the OR function would then be zero of the symbols matched, and one if they did not.

In the particular case of a binary symbol alphabet, i.e., an alphabet of only two symbols, the probability estimator of FIG. 3A can be simplified as shown in FIG. 3B. The simplification arises out of the fourth case of TABLE 1. Because there are only two symbols in the alphabet, if neither the new symbol nor the old symbol matches the given symbol, then it follows that the old and new symbols match each other. Accordingly, for determining the absolute magnitude of a probability variance, the logical test reduces to a test of whether the old and new symbols match. If they do, then, regardless of whether they match the given symbol, the number of occurrences of the given symbol in the interval does not change, and the probability variance is zero. If the new and old symbols do not match, then one of the new and old symbols is the given symbol, and the other is not. As a consequence, the number of occurrences of the given symbol in the interval must change. Therefore, the probability variance has a non-zero magnitude.

Referring to FIG. 3B, an array of logic devices 97 is provided for receiving the old symbols from the various intervals of the context extractor 1, and testing whether those old symbols match the given symbol. The devices 97 are shown as EXCLUSIVE OR (XOR) gates.

Each probability estimator includes one XOR gate for each interval in the context extractor 1. The XOR gates in the array 97 receive the new symbol as a first input, and the given symbol as a second input. As in the case of FIG. 3A, the given symbol is provided in a suitable manner, such as by hard-wiring or storage in a register.

The results are stored in the temporary register 105, in the form of a binary number. The respective bit positions of the binary number act as weight factors for the respective intervals. The temporary register 105 stores the result of the XOR operation performed on an arriving new symbol (ns) and the old symbols $os_{(k)}$ which are leaving the last position of each of the plurality of nested intervals stored in the symbol context extractor 101.

The adder/subtractor 106 is again provided for adding the resultant binary number to, or subtracting it from, the probability value stored in the register 104. In accordance with the second and third cases of TABLE 1, addition or subtraction is performed based on whether the new symbol matches the given symbol.

The XOR device 107 is again provided for receiving the new symbol, comparing it with the given symbol for this probability generator, and providing an output signal indicating a match or mismatch. The adder/subtractor 106 receives this signal as a control signal, and performs addition or subtraction based on its value. If the new symbol ns matches the given symbol, then the contents of temporary register 105 are added to the contents of the probability register 104 in order to adaptively estimate the probability of the given symbol at the subsequent interval ($p_s(t+1)$). If the new symbol ns does not match the given symbol, then the contents of temporary register 105 are subtracted from the contents of the probability register 105 in order to adaptively estimate the probability of the given symbol at the subsequent interval ($p_s(t+1)$).

The relationship between initial probabilities, a new symbol, old symbols and updated probabilities may best be illustrated by example. For the purpose of illustration, a system employing a binary symbol alphabet is shown. However, the correlation is not unique to a binary alphabet, and may be extended to any finite alphabet.

FIGS. 4A–4E are five snapshots showing the operation of the probability estimator of FIG. 3B. As discussed above, the illustrated probability estimator is associated with a particular given symbol. For the purpose of illustration, the data stream is shown as a stream of 1s and 0s, representing a binary alphabet. As will be discussed below, the invention may be applied to alphabets of n-ary symbols. In such an alternative embodiment the illustrated binary symbol stream could be the result of a logical matching check between the symbols of an n-ary data stream and a given symbol associated with the illustrated probability estimator. For instance, a 1 could indicate a match and a 0, a mismatch. In such an alternative embodiment, suitable checking circuitry, such as XOR devices, would be provided. Then, a stream of 1s and 0s would be provided to the probability estimators, as shown.

For each of the five snapshots in FIGS. 4A–4E, the symbol stream arrives at the left and moves from left to right. It will be seen that the contents of the content extractor 1 shift to the right in each successive snapshot, and the incident values enter the content extractor from the left, one by one.

FIG. 4A shows an example of a symbol string with the most recent eight symbol occurrences provided within the symbol context extractor 1. The symbol context extractor 1 also offers a set of four nested intervals. According to the characteristics for the intervals as defined above, the interval lengths are integral powers of two. In the example, interval lengths are taken as 1, (the left-most symbol) 2, (the left-most two symbols) 4, (the left-most four symbols) and 8 (all eight of the symbols shown). Further, the number of intervals, four, is an integral power of two.

FIG. 4A also shows an initial probability stored in the probability register 104. For the purpose of this illustration, the initial probability could be whatever probability the system derived in the course of its operation, based on the sequence of symbols received heretofore.

However, if the system were just starting up, and no symbols had been received as yet, then the initial probability must be derived as the basic frequency of a symbol occurrence according to expression (1). Thus, in FIG. 4A, the initial probability of the given symbol (1) is:

$$P(1) = \tfrac{1}{4}(0/1 + \tfrac{1}{2} + \tfrac{3}{4} + \tfrac{5}{8}) = 15/32 \qquad (6a)$$

FIG. 4A also shows the temporary register 105, which provides the contents of the result of an XOR comparison of the value of the new symbol entering the symbol context extractor 1 with the value of the respective old symbols $os_{(k)}$ leaving the last position of each of the k number of nested intervals.

The operation of the probability estimator is as follows. The oldest symbol of each of the four intervals within the context extractor 1 is XORed with the new symbol entering. That new symbol is to be the newest symbol of each interval. It will be seen that the XOR operation will have a 0 result for a given interval, if either (i) a non-matching symbol shifts out of the interval and a non-matching symbol shifts in, or (ii) a matching symbol shifts out and a matching symbol shifts in. Either way, the probability variance for that interval is zero. On the other hand, the XOR operation will have a 1 result if (iii) non-matching symbol shifts out and a matching symbol shifts in, or (iv) a matching symbol shifts out and a non-matching symbol shifts in. In case (iii), the probability variance is an increase for the interval, and in case (iv) it is a decrease. The non-zero result of the XOR operation is added to or subtracted from the probability, as appropriate.

The results of the XOR operations are stored as a binary number in the temporary register 105. The binary number is added to or subtracted from the current probability in the probability register 104 in accordance with the value of the incoming symbol. The register 104 has an implicit binary point following the first bit, reflecting the fact that the maximum probability value in this example is 1.0.

While, in the illustrated example, a binary number is produced, in other embodiments, a number having a given radix other than two could be used. In such alternative embodiments, the digits (according to the radix of the particular number system used) would still correspond with respective intervals. Also, while the binary digits shown reflect weight factors which correspond with reciprocals of integral powers of two, in these other embodiments, the respective weight factors would correspond with reciprocals of integral powers of the radix.

If the oldest symbol is not the given symbol, then the number of given symbols in the interval goes up, and the probability increases for that interval. Accordingly, the value in the temporary register 105 which is added to the current probability, contains a 1 bit for each interval ill which a symbol not matching the given symbol is shifting out, weighted by bit position in accordance with the interval.

FIG. 4B shows the contents of the symbol context extractor 1 upon the arrival of a new symbol ns which does not match the given symbol of the probability estimator, and the contents of the probability register 104. The probability may be updated in a manner consistent with expression (6a), above:

$$P(1) = \tfrac{1}{4}(0/1 + 0/2 + 2/4 + 4/8) = 8/32 \qquad (6b)$$

Thus, the invention takes advantage of the relationship of the characteristics of the symbol context extractor 1 as well as the value of a new symbol entering each nested interval and old symbol leaving the last position of each nested interval. The probability is updated upon the arrival of a new symbol by first comparing the value of the new symbol with the old symbols leaving each nested interval. According to the invention, the comparison is that of an XOR operation, with the result being either added or subtracted to the initial probability. If the value of the arriving new symbol is that of the given symbol, the contents of the temporary register are added to the initial probability. If the value of the arriving new symbol is not that of the given symbol, then the contents of the temporary register are subtracted from the initial probability.

Thus in the example, the temporary register in FIG. 4A offers the results of an XOR operation with an arriving new symbol ns and the old symbols leaving each of the plurality of nested intervals. Inasmuch as the value of the arriving new symbol (0) is not the same as that of the given symbol (1), the contents of the temporary register are subtracted from the contents of the initial register 104. Performing the operation yields the following:

```
  01111
 −00111
  01000 = 8/32
```

It will be seen that the value of the result are consistent with the probability estimation of expression (6b), above.

FIG. 4C illustrates the case in which the value of the arriving new symbol is the same as that of the given symbol. As before, the probability upon the transition may be estimated as:

$$p(1) = \tfrac{1}{4}(1/1 + \tfrac{1}{2} + 2/4 + \tfrac{5}{8}) = 21/32 \tag{6c}$$

The contents of the temporary register are again updated to reflect the relationship between the value of the arriving new symbol and old symbols leaving the last position of each of the set of nested intervals. Inasmuch as the value of the arriving new symbol (1) is the same as that of the given symbol (1), the contents of the temporary register are added to the contents of the probability register (104). Performing the operation yields the following result:

```
  01000
 +01101
  10101 = 21/32
```

The value of the result are again consistent with the probability estimation of expression (6c), above.

FIG. 4D illustrates the case in which the value of an arriving new symbol is again the same as that of the given symbol. As before, the probability upon the transition may be estimated as:

$$p(1) = \tfrac{1}{4}(1/1 + 2/2 + 2/4 + \tfrac{5}{8}) = 25/32 \tag{6d}$$

Again, the contents of the temporary register are updated to reflect the relationship between the value of the arriving new symbol and old symbols leaving the last position of each of the set of nested intervals. Inasmuch as the value of the arriving new symbol (1) is the same as that of the given symbol (1), the contents of the temporary register (105) are added to the contents of the probability register (104). Performing the operation yields the following result, shown in FIG. 4E:

```
  10101
 +00100
  11001 = 25/32
```

The embodiments of FIGS. 1 and 2 are suitable for use with a binary data stream, or for use in conjunction with suitable circuitry for comparing each symbol of the data stream with a given symbol (such as by XOR-ing) and producing a binary value indicating whether each data symbol matched the given symbol. However, the invention may also be directly practiced with respect to a stream of n-ary symbols.

Figure 5:
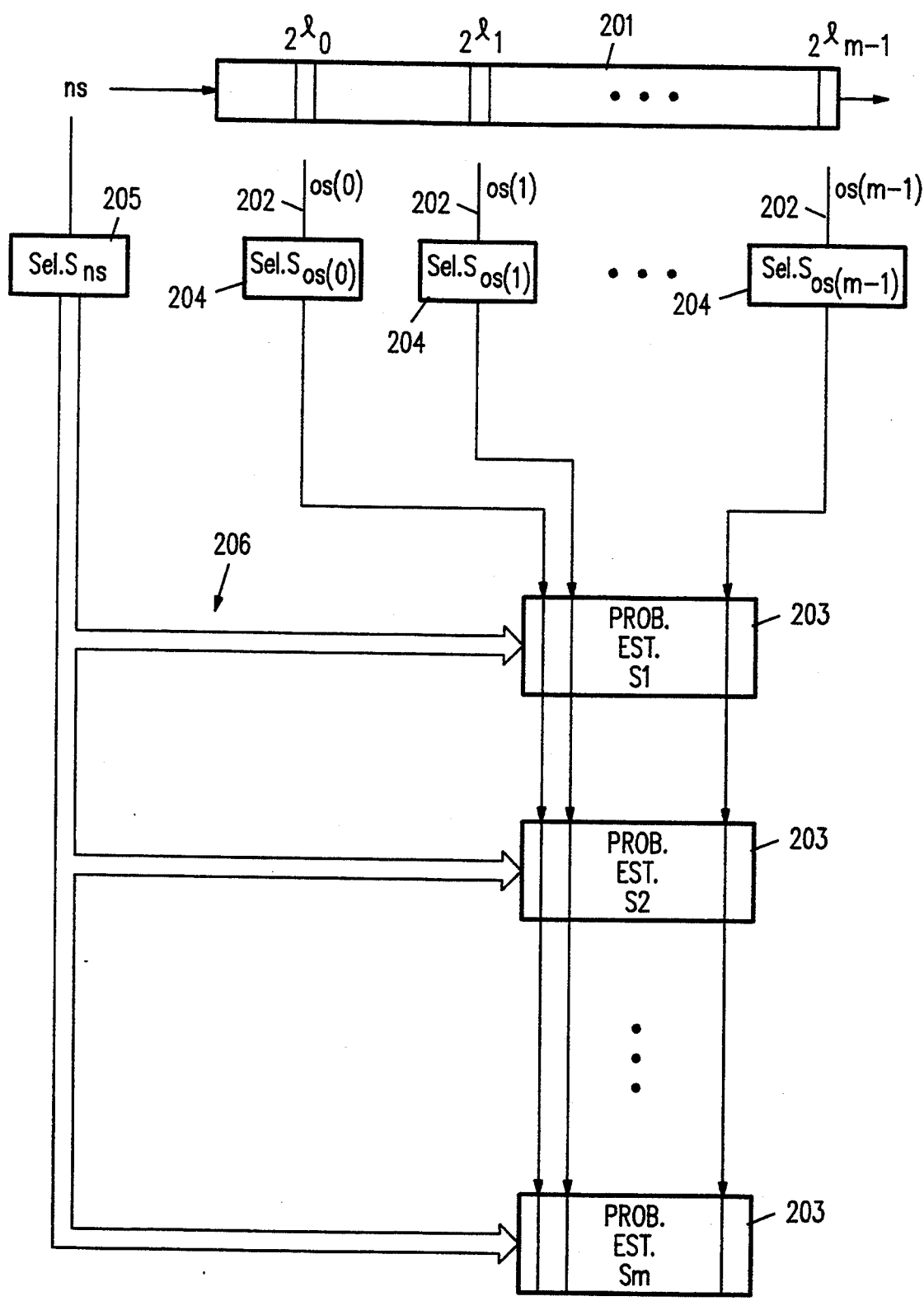
FIG. 5 is a block diagram of a probability estimator for an n-ary alphabet according to yet another embodiment of the invention.

Referring now to FIG. 5, there is disclosed a system architecture analogous to that of FIG. 1 For use with a stream of n-ary symbols. The architecture has been expanded to provide means For performing the symbol checks on a per bit basis For n-ary symbols in a data stream. The stream can be serial or parallel, and can conform to any suitable communication protocol, which might include headers or other overhead information. Data is extracted therefrom, in an appropriate manner not essential to the invention, and the extracted data is then provided to the system of FIG. 5.

A context extractor 201 is analogous to the context extractor 1 of FIG. 1. For simplicity, the encoder 4 has been omitted from FIG. 5, but is understood to be present. Data symbols, shown as "ns", are provided to the context extractor 201 as shown. As before, the context extractor 201 is preferably either a data shift register or a circular buffer. The context extractor 201 includes a plurality of intervals. As with the embodiment of FIG. 1, computational efficiency is realized if the intervals have certain characteristics. That is, the intervals are nested such that each includes the most recently received symbol, the intervals have sizes which are preferably integral powers of two, and the number of intervals is preferably an integral power of two.

Suitable means, such as pointers or data laps which would be known to a person of ordinary skill in the art, are provided for identifying the ends of the intervals, at which the old symbols os(k) are provided. Accordingly, the ends of the intervals are labelled os(0) through os(m−1). The respective intervals include memory capacity for storing $2^{(l(0))}$ through $2^{(l(m-1))}$ symbols.

While the symbols in the context extractor, or symbol memory, 201 may be represented in binary codes of more than one bit, the same essential tests as those in the previously discussed embodiments are applicable. That is, the new and old symbols are compared, and the probability variance has a non-zero magnitude if they do not match. The new symbol is compared with the given symbol, and a non-zero probability variance is added to the old probability if the new symbol is the given symbol, and subtracted otherwise. Therefore, essentially the same XOR functions need to be performed, except that they are performed on a bit-by-bit basis for multi-bit symbols, rather than being performed by single XOR gates on single bit symbols.

It will thus be understood that the XOR operations can be performed by logic means residing inside the probability estimators. In such an implementation, the old symbols would be bussed from the ends of the intervals to the probability estimators, the new symbol would be bussed From the new symbol input to the probability estimators, and the given symbols would be made available to the respective probability estimators in a suitable manner, such as by hard wiring or storing in a suitable register.

However, a preferred embodiment of the invention for n-ary symbol alphabets includes additional components shown in FIG. 5. At the end of each interval, there is a bus 202 coupled to the symbol memory 201 for extracting the symbol thereat. The busses 202 are represented as lines in FIG. 5, but it will be understood that the busses 202 have a construction suitable for carrying a multi-bit symbol. For instance, the busses 202 could be parallel, having a number of separate leads suitable For the number of bits making up the symbols.

The busses 202 are routed to a plurality of selectors 204 which perform the XOR operation between the old and new symbols, on a bit by bit bases, and OR the resultant bits together to produce a single bit whose value indicates whether or not the old and new symbols match. The outputs of the selectors 204 are bussed to probability estimators 203. The probability estimators 203 are, for the most part, functionally equivalent to the probability estimator of FIG. 3. However, the logic within the selectors 204 take the place of the gates 97 of FIG. 3, which are omitted here.

In an n-ary alphabet, the number of symbols is likely to be larger than the two symbols in the binary alphabet discussed above, so it will be understood that a larger number of probability estimators 203 will be provided. Again, the number of probability estimators 203 is equal to the number of symbols m in the alphabet, unless a subtractor and accompanying hardware, similar to those shown and described in connection with FIG. 2, are provided, in which case the number of probability estimators 203 is reduced by one, to n−1.

The new symbol enters the first position of the context extractor 201, as with the previously discussed embodiments, and therefore enters each of the nested intervals. The new symbol also goes to a selector 205, which functions essentially as a decoder. The selector 205 has n outputs, one corresponding with each of the symbols of the alphabet, which are coupled through bus lines 206 to the respective probability estimators 203. The selector 205 identifies which of the symbols of the alphabet the new symbol is, and provides an output signal in a first state, such as a high logic signal, to the probability estimator 203 for which that symbol is the given symbol. The selector 205 provides an output signal in a second state, such as a low logic signal, to all of the other probability estimators 203. Thus, the XOR gate 107 of the probability estimator of FIG. 3 is also omitted.

Taking into account the structural differences between the embodiment of FIG. 5 and the previously discussed embodiments, the probability estimators 203 operate in essentially the same fashion to produce probability variances and update the stored probability values for each of the symbols of the alphabet. These probabilities are then provided to an encoder (not shown) for encoding of the symbol stream.

From the foregoing discussion of the preferred embodiments of the invention, it will be seen that the probability values for a given symbol of the alphabet can vary from 0 to 1. If the given character does not appear anywhere in a symbol stream sufficiently large to fill up the largest interval in the context extractor 1 or 201, then the probability for that character will be 0. On the other hand, if a repeating sequence made up entirely of the given character were received, so as to fill up the entire context extractor 1 or 201, then the probability is 1. These conditions are true either for equation 1 (equal weighting) or equation 2 (greater weight to more recently received symbols).

In certain applications, such as arithmetic coding, however, other considerations sometimes dictate that all probabilities must be strictly positive, but less then one. In accordance with the invention, a modification of the method and apparatus shown meets the requirement that all probabilities be non-zero and positive, while not greatly decreasing their accuracy.

Another preferred embodiment of the invention, incorporating this modification, involves calculating the probability for a given symbol, within at least one interval, by assuming that at least one symbol within the interval is the given symbol. This is preferably done with respect to the largest interval, or the interval having the lowest weight, in order to minimize an inconsistency between the calculated probability and the actual probability of occurrence of the symbol in the symbol stream.

It is also preferable that this be done by treating certain symbol positions of the interval as containing each of the symbols of the alphabet. That is, if there are n symbols in the alphabet, then n symbol positions are reserved, and treated as though one of each of the n symbols in the alphabet are contained within the n symbol positions. A greater number of symbol positions may be so used, in which case one or more of the symbols would have more than one position. However,, by limiting each symbol to one position, the inconsistency between the calculated probability and the actual probability of occurrence of the symbol is again minimized. The symbol positions used preferably fall within the largest interval, but outside the other, smaller, intervals, thus giving the smallest possible weight to each of the symbols therein.

Figure 6:
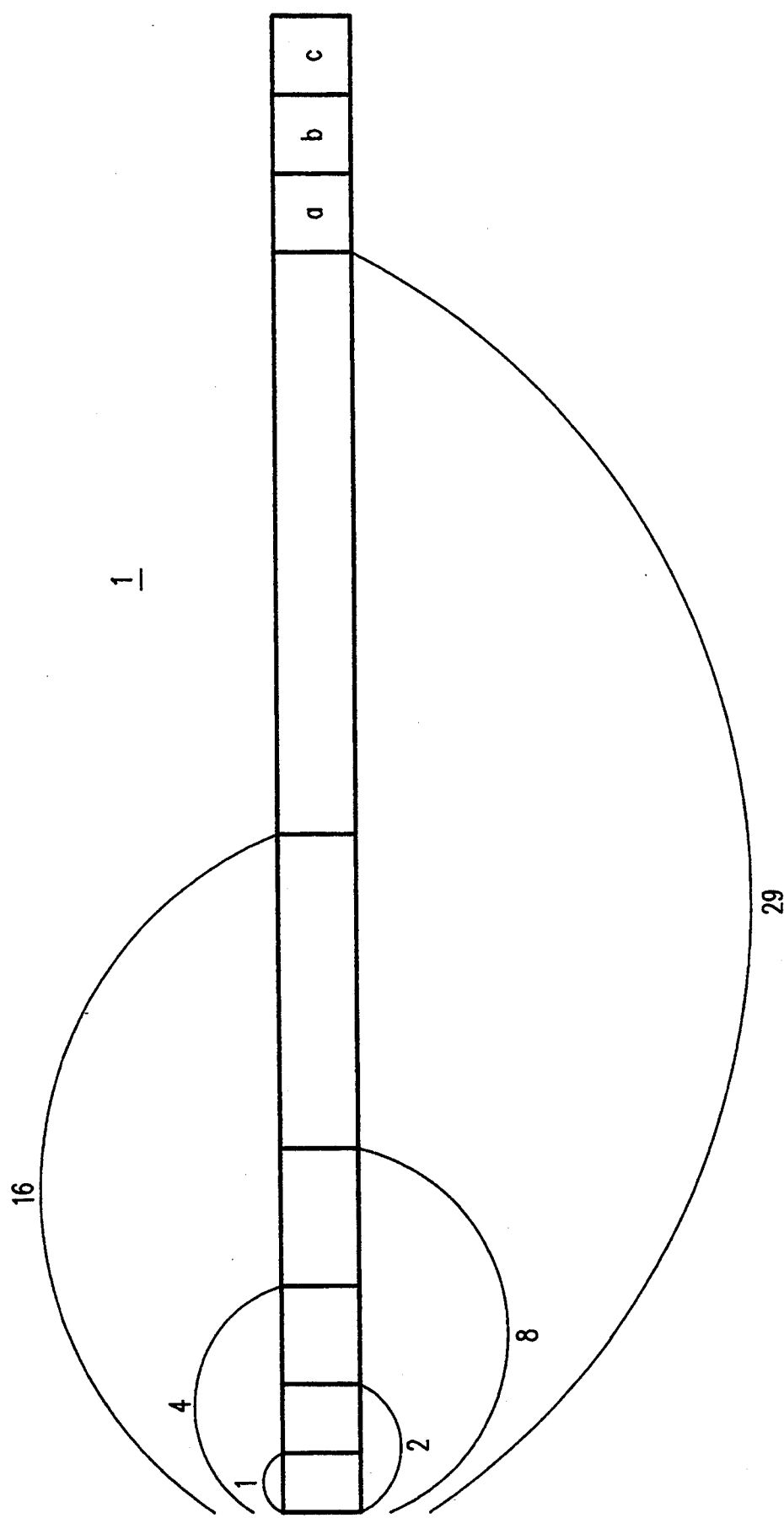
FIG. 6 is a schematic representation of a context extractor according to yet another embodiment of the invention.

FIG. 6 is a schematic representation of the context extractor 201 similar to that of FIG. 5. For the purpose of illustration, the following conditions are assumed. The context extractor 201 has a capacity of 32 symbols. The data stream includes symbols from a three symbol alphabet. The symbols making up the alphabet are a, b, and c. The data stream enters the context extractor 201 from the left. For illustrative purposes, six intervals are shown. As per the preceding discussion, the intervals all begin at the left. In accordance with this aspect of the invention, the sizes of the intervals are related by powers of 2, except for the largest interval. The final three symbol positions of the largest interval contain one of each of the three symbols in the alphabet. Accordingly, instead of 32 symbol positions for incoming symbols, the largest interval has 32 −3=29 symbol positions. However, the symbol probability calculation is still made over all 32 symbol positions of the interval. Thus, even if one of the symbols does not appear in the data stream, the probability for that symbol will have a non-zero, positive value, and be less than one.

When an arrangement like this is used with a context extractor having m intervals related by powers of 2, and an n-symbol alphabet, then the lowest possible probability for a symbol is increased from 0 to $$\frac{1}{m \times 2 \exp l_{(m-1)}}$$

Also, the maximum possible probability for any symbol is decreased from 1 to $$1 - \frac{(n-1)}{m \times 2 \exp l_{(m-1)}}$$

While the preferred embodiments of the invention are illustrated in terms of hardware components such as registers, logic gates, etc., it will be readily understood that the invention may also be embodied in software. The registers which hold the probability values and the temporary registers could readily be implemented as software-accessible memory structures, such as addressible computer memory locations. If the context extractors are implemented as circular buffers, they are essentially software data structures which are accessed using pointers controlled by software. Alternatively, a software equivalent of a shift register could be employed by a skilled programmer without difficulty. The logical operations, which were illustrated as being performed by hardware logic gates, could also be performed by appropriate software operations. Thus, the method of the invention could be practiced in software as well as hardware, or in a suitable combination of hardware and software. Also, the invention could be embodied in a computer program product, such as a programmed floppy disk, memory module, etc., which would be used by a computer system or data encoding system. Such a product would include a recording medium and software means, recorded thereon, for instructing the computer system or data encoding system to perform operations in accordance with the detailed description of the invention given above.

The invention has been described in terms of the preferred embodiments shown. However, it will be understood that the invention is not limited to these embodiments. Rather, any modifications or equivalent embodiments of the invention which would be obvious to a person of ordinary skill in the art, given this disclosure, are within the spirit and scope of the invention, as recited in the appended claims.

What is claimed is:

1. A method for estimating a probability that a given symbol of a finite alphabet will occur in a symbol string of symbol of the finite alphabet, the method comprising the steps of:
weighting occurrences of previously occurring symbols held in a storage medium with weight factors which are greater for more recently occurring symbols than for less recently occurring symbols; and
calculating a probability that the next occurring symbol will be the given symbol based on the weighted previous occurrences of the given symbol;
wherein the step of weighting includes defining a plurality of intervals within the storage medium, the given symbol having a respective number of occurrences in each of the plurality of intervals, the previously occurring symbols being weighted according to the number of intervals within which the previously occurring symbols fall.

2. A method ns recited in claim 1, wherein the step of calculating includes calculating the probability based on the respective numbers of occurrences of the given symbol in the plurality of intervals.

3. The method of claim 2 wherein the step of defining includes defining a number of intervals equal to an integral power of 2.

4. The method of claim 2 wherein the step of defining includes defining the intervals as having lengths, ratios therebetween being integral powers of two.

5. The method of claim 2 wherein the step of defining includes defining the intervals as being nested.

6. The method of claim 5 wherein the step of defining includes defining each interval of the plurality of intervals to include a most recently arrived symbol of the interval, the most recently arrived symbol being the same for each of the plurality of intervals.

7. The method of claim 2 wherein:
the method further comprises the step of initially calculating and storing a probability; and
the step of calculating includes
(i) calculating a change of probability, and
(ii) modifying the stored probability in accordance with the change of probability.

8. The method of claim 7 wherein the step of initially calculating and storing includes:
identifying a first portion of the symbol string residing within the plurality of intervals;
counting the number of occurrences of the given symbol in each of the plurality of intervals;
normalizing the numbers of occurrences within the plurality of intervals;
calculating an average of the normalized numbers of occurrences; and
storing the average.

9. The method of claim 7 wherein the step of calculating a change of probability includes:

(i) determining whether a new symbol of the symbol string, which is entering each of the intervals, is the given symbol, and
(ii) determining, for each of the plurality of intervals, whether an old symbol of the symbol string, which is leaving the interval, is the given symbol.

10. The method of claim 9 wherein the step of calculating a change of probability includes calculating a magnitude value having a respective component corresponding to each of the plurality of intervals, each respective component having:
(i) a first value if the new symbol and the old symbol both match the given symbol, or if neither the new symbol nor the old symbol match the given symbol, and
(ii) a second value if one of the new symbol and the old symbol matches the given symbol, but the other of the new symbol and the old symbol does not match the given symbol.

11. The method of claim 10 wherein the step of modifying includes:
(i) adding the magnitude to the stored probability if the new symbol matches the given symbol, and
(ii) subtracting the magnitude from the stored probability if the new symbol does not match the given symbol.

12. The method of claim 10 wherein the step of calculating the magnitude value includes weighting the respective components according to respective weight factors.

13. The method of claim 12 wherein the step of calculating a magnitude value includes calculating a number having a plurality of digits in a number system of a given radix, the digits respectively corresponding with the intervals, the respective weight factors corresponding with reciprocals of integral powers of the radix.

14. The method of claim 13 wherein the step of calculating a magnitude value includes calculating a binary number having a plurality of binary digits respectively corresponding with the intervals, the respective weight factors corresponding with reciprocals of integral powers of two.

15. The method of claim 12 wherein the step of calculating a magnitude value includes calculating a plurality of numbers, each of the plurality of numbers having a plurality of digits in a number system of a given radix, the digits respectively corresponding with the intervals, the respective weight factors corresponding with reciprocals of integral powers of the radix.

16. An apparatus for estimating a probability that a given symbol of a finite alphabet will occur in a symbol string of symbols of the finite alphabet, the apparatus comprising:
means for storing previously occurring symbols;
means for weighting the stored symbols with weight factors that are greater for more recently occurring symbols than for less recently occurring symbols; and
means for calculating the probability that the next occurring symbol will be the given symbol based on the weighted previous occurrences of the given symbol;
wherein the means for weighting includes means for defining a plurality of intervals within the storage means, the given symbol having a respective number of occurrences in each of the plurality of intervals, the previously occurring symbols being weighted according to the number of intervals within which the previously occurring symbols fall.

17. An apparatus as recited in claim 16 wherein the means for calculating includes means for calculating the probability based on the respective numbers of occurrences of the given symbol in the plurality of intervals.

18. The apparatus of claim 17 wherein the means for defining includes a memory device having an input for sequentially receiving symbols of the symbol stream.

19. The apparatus of claim 18 wherein the memory device includes one of a shift register and a circular buffer.

20. The apparatus of claim 18 wherein the device has a plurality of outputs, respectively corresponding with the plurality of intervals, for providing symbols of the symbol string leaving the respective intervals concurrently with the reception of symbols of the symbol stream at the input.

21. The apparatus of claim 20 wherein the means for defining includes means for defining a number of intervals equal to an integral power of 2.

22. The apparatus of claim 20 wherein the means for defining includes means for defining the intervals making up the plurality as having lengths, ratios therebetween being integral powers of two.

23. The apparatus of claim 20 wherein the means for defining includes defining each interval of the plurality of intervals to include a most recently arrived symbol of the interval, the most recently arrived symbol being the same for each of the plurality of intervals.

24. The apparatus of claim 17 wherein:
the apparatus further comprises means for initially storing a probability: and
the means for calculating includes:
(i) means for calculating a change of probability, and
(ii) means for modifying the stored probability in accordance with the change of probability.

25. The apparatus of claim 24 wherein the means for calculating a change of probability includes:
means for determining whether a new symbol of the symbol string, which is entering each of the intervals, is the given symbol; and
determining, for each of the plurality of intervals, whether an old symbol of the symbol string, which is leaving the interval, is the given symbol.

26. The apparatus of claim 25 wherein the means for calculating a change of probability includes means for calculating a magnitude value having a respective component corresponding to each of the plurality of intervals, each respective component having:
(i) a first value if the new symbol and the old symbol both match the given symbol, or if neither the new symbol nor the old symbol match the given symbol, and
(ii) a second value if one of the new symbol and the old symbol matches the given symbol, but the other of the new symbol and the old symbol does not match the given symbol.

27. The apparatus of claim 26 wherein the means for calculating a change of probability includes logic circuitry.

28. The apparatus of claim 26 wherein logic circuitry includes EXCLUSIVE OR (XOR) circuitry.

29. The apparatus of claim 26 wherein the means for modifying includes:

means for adding the magnitude to the stored probability if the new symbol matches the given symbol, and
means for subtracting the magnitude from the stored probability if the new symbol does not match the given symbol.

30. The apparatus of claim 29 wherein the means for modifying includes an adder/subtractor having a control input coupled to receive a signal having a first value if the new symbol matches the given symbol, and having a second value if the new symbol does not match the given symbol.

31. The apparatus of claim 26 wherein the means for calculating the magnitude value includes means for weighting the respective components according to respective weight factors.

32. The apparatus of claim 31 wherein the means for calculating a magnitude value includes means for calculating a number having a plurality of digits in a number system of a given radix, the digits respectively corresponding with the intervals, the respective weight factors corresponding with reciprocals of integral powers of the radix.

33. The apparatus of claim 32 wherein the means for calculating a magnitude value includes means for calculating a binary number having a plurality of binary digits respectively corresponding with the intervals, the respective weight factors corresponding with reciprocals of integral powers of two.

34. The apparatus of claim 31 wherein the means for calculating a magnitude value includes means for calculating a plurality of numbers, each of the plurality of numbers having a plurality of digits in a number system of a given radix, the digits respectively corresponding with the intervals, the respective weight factors corresponding with reciprocals if integral powers of the radix.

35. A data encoding system for adaptively and predictively encoding a string of symbols, from a finite alphabet which comprises a plurality of symbols, in accordance with frequencies of occurrence of the symbols in the string, the system comprising:
a context extractor for receiving the symbol string to be encoded, the context extractor having an input for receiving each successive symbol of the string as a new symbol, and having a plurality of intervals and respective outputs for each of the plurality of intervals, the outputs being for providing successive final symbols of the intervals as respective old symbols; and
a plurality of probability estimators respectively corresponding to given ones of the plurality of symbols in the finite alphabet, each of the probability estimators including circuitry for receiving the new symbol and the old symbols, and for updating a probability value for the occurrence of the given symbol corresponding thereto based on whether the new symbol matches the given symbol, and whether the respective old symbols match the given symbol.

36. The system of claim 35, wherein the context extractor includes one of a shift register and a circular buffer.

37. The system of claim 35 wherein each probability estimator includes:
a probability register for storing the probability value for the occurrence of the given symbol;

circuitry for calculating a probability update value based on whether new symbol matches the given symbol and whether the respective old symbols match the given symbol; and circuitry for updating the probability value stored in the probability register in accordance with the probability update value.

38. The system of claim 37 wherein the circuitry for calculating includes EXCLUSIVE OR (XOR) circuitry.

39. The system of claim 37 wherein the circuitry for updating includes an adder/subtractor which (i) adds the probability update value to the stored probability if the new symbol matches the given symbol, and (ii) subtracts the probability update value from the stored probability if the new symbol does not match the given symbol.

40. A computer program product, for use with a data encoding system which receives and encodes a symbol stream according to a coding scheme based on frequencies of past occurrences of symbols within the symbol stream, the computer program product comprising:

a recording medium;

means, recorded on the recording medium, for directing the data encoding system to weight occurrences of previously occurring symbols within the symbol stream with weight factors which are greater for more recently occurring symbols than for less recently occurring symbols;

means, recorded on the recording medium, for directing the data encoding system to calculate a probability that the next occurring symbol in the symbol stream will be a given one of the symbols based on the weighted previous occurrences of the given symbol;

wherein the means for directing to weight includes means, recorded on the recording medium, for directing the data encoding system to define a plurality of intervals within which the previously occurring symbols of the symbol stream fall, the previously occurring symbols being weighted according to which of the intervals within which the previously occurring symbols fall.

41. A computer program product as recited in claim 40 wherein the means for directing to define includes means, recorded on the recording medium, for directing the data encoding system to define the intervals as each including the most recently arrived symbol of the symbol stream, and as including respective numbers of consecutively arrived symbols ranging backward in time therefrom.

42. A computer program product as recited in claim 41, wherein the means for defining includes means, recorded on the recording medium, for directing the data encoding system to define:

(i) a number of intervals equal to an integral power of two, and (ii) lengths of the intervals having ratios of integral powers of two.

43. A computer program product as recited in claim 41, wherein the means for directing to calculate includes means, recorded on the recording medium, for directing the data encoding system to:

(i) initially calculate and store probabilities for each symbol based on past occurrences of each symbol, (ii) calculate, responsive to receipt of a new symbol of the symbol stream, a change of probability for each symbol based on the new symbol and a respective old symbol leaving each interval as the new symbol enters each interval, and (iii) modify the stored probabilities in accordance with the calculated changes of probability.

* * * * *